United States Patent [19]

Wallrafen

[11] Patent Number: 4,658,211
[45] Date of Patent: Apr. 14, 1987

[54] CIRCUIT FOR REGULATING THE TORQUE OF RATIO METERS

[75] Inventor: Werner Wallrafen, Kelkheim, Fed. Rep. of Germany

[73] Assignee: VDO Adolf Schindling AG, Frankfurt am Main, Fed. Rep. of Germany

[21] Appl. No.: 675,584

[22] Filed: Nov. 28, 1984

[30] Foreign Application Priority Data

Dec. 3, 1983 [DE] Fed. Rep. of Germany ....... 3343850

[51] Int. Cl.⁴ .......................... G01R 7/00; H03K 5/08
[52] U.S. Cl. ................................. 324/140 D; 324/110; 324/115; 324/123 C; 307/553
[58] Field of Search .................... 324/110, 140 D, 115, 324/140 R, 123 R, 123 C, 143; 33/117 D, 355 R, 357; 307/264, 362, 552, 553; 318/650, 671, 677

[56] References Cited

U.S. PATENT DOCUMENTS

3,746,978 7/1973 Rogachev et al. ......... 324/140 D X

FOREIGN PATENT DOCUMENTS

2800084 7/1979 Fed. Rep. of Germany .... 33/355 R
0190985 6/1965 U.S.S.R. .......................... 324/140 D
0866490 9/1981 U.S.S.R. .......................... 324/140 D Primary Examiner—Reinhard J. Eisenzopf
Assistant Examiner—Jack B. Harvey
Attorney, Agent, or Firm—Martin A. Farber

[57] ABSTRACT

In order to maintain the torque of the ratio meter and the drive of amplifiers feeding it independently of the amplitudes of a sine signal voltage and a cosine signal voltage, a regulation is provided. The regulation makes use of two-quadrant voltage-controlled sources of current each of which is connected to a coil branch. Control voltage amplifiers, one connected in front of each source of current, are furthermore used. A sum-current resistor is provided to form the sum of the supply currents of two voltage-controlled sources of current. The supply currents represent the amounts of the sine signal voltage and cosine signal voltage which act on the voltage amplifiers. From the resistor for the formation of the sum of the supply currents a signal is derived which switches the amplification of the voltage amplifiers automatically in the direction of compensation.

6 Claims, 2 Drawing Figures

CIRCUIT FOR REGULATING THE TORQUE OF RATIO METERS

FIELD AND BACKGROUND OF THE INVENTION

The present invention relates to a circuit for regulating the torque of ratio meters in general. In particular the invention relates to a circuit for regulating the torque of ratio meters, particularly of compass indicators, in which coil branches (1 and 2) are connected to respective two-quadrant voltage-controlled sources of current (4, 6) which are fed via (voltage) amplifiers (3, 5) with a sine signal voltage and cosine signal voltage, respectively In general, ratio meters operate in the manner that the deflection of the pointer is dependent on the ratio of the currents flowing through two coil branches of the ratio meter. Thus, in first approximation, the absolute values of the currents do not affect the deflection of the pointer as long as their ratio remains the same. This basic advantage of the ratio meter is, however, limited by the fact that, in the case of small currents in the coil branches, the torque produced is not sufficient to definitely move the pointer into the exact position corresponding to the currents. If (measurement) amplifiers are used to amplify weak currents, the control limits of the amplifier, on the other hand, must be observed, since otherwise, if the input voltage of the amplifiers exceeds a predetermined value, then the output voltage is no longer proportional. These limits of accuracy of the measurement principle of a ratio meter are even narrower in actual practice, due to manufacturing tolerances. These limits of accuracy are disturbingly noticeable in the case of a measurement in which the position of the horizontal component of the terrestrial magnetic field with respect to the longitudinal axis of a vehicle is to be measured and converted into a proportional deflection of the pointer of a ratio meter. The horizontal component of the induction is greatly dependent on the geographical position of the vehicle.

Specifically, in one known compass system having a magnet probe which operates in accordance with the known principle of the flux-gate magnetic-field measurement a sine signal voltage and a cosine signal voltage are produced which correspond to the sine and cosine respectively of the angle of a vector of the horizontal component of induction of the magnetic field surrounding the magnet probe, referred to a given axis (the longitudinal axis of the vehicle). The sine signal voltage and the cosine signal voltage are converted, in each case via a voltage-controlled source of current which operates in two characteristic-curve quadrants, into proportional currents each of which is fed into a separate one of the two coil halves of the ratio meter. The deflection of the pointer of this ratio meter is then proportional to the arc tangent of the ratio of the two signal voltages. As stated above, however, this compass system can operate satisfactorily only in certain geographical locations. For this reason, upon the manufacture of the compass system at least one part, namely the magnet probe, is so adapted that the signal voltages lie in a predetermined range at the intended place of use. This procedure results in greater expense in connection with manufacture and stocking.

In highly developed compass systems which permit compensation for the magnetic declination and the deviation produced by the vehicle, an analog computer is used to process the sine signal voltage and the cosine signal voltage, the amount of the vector, among other things, being formed in it from the two signal voltage components. This so-called b-signal is used to form the sine and the cosine of the vector direction of the horizontal component of the induction with respect to the given axis. It has not been attempted to use this b-signal, which also represents a measure of the amount of the horizontal component of the induction, for the amplitude standardization of magnetic fields of different intensity by dividing the sine and cosine signal voltages by the amount of the vector. This use would also be limited to said high-grade compass systems in which the b-signal is calculated in a relatively expensive manner.

The object of the present invention is to create a circuit for the less expensive regulating of the torque of ratio meters in which each coil half is traversed by a current which is produced from an amplified signal voltage by a voltage-controlled source of current operating in two quadrants. This circuit, therefore, makes it possible to dispense with an analog computer for the division by the so-called b-signal.

SUMMARY OF THE INVENTION

According to the invention means (sum-current resistor 7) are provided to form the sum of the supply currents of two voltage-controlled current sources (4, 6) and that the amplification factors of two (voltage) amplifiers (3, 5) can be automatically switched as a function of the sum of the supply currents.

By sum current there is understood therein a current which represents the sum of individual supply currents. This sum can be formed in extremely simple manner as sum of the supply currents of the two voltage-controlled current sources operating in two quadrants.

The supply currents of the two voltage-controlled current sources are conducted over a common sum resistor on which there takes place a voltage drop which corresponds to the sum. More specifically, the invention is characterized by the fact that into a line carrying the sum of the supply currents there is inserted a sum-current resistor (7) which is connected to an input (8) of a comparator (9), and that in order to change the amplification factor of each of the two (voltage) amplifiers (3, 5) there is provided a switch which can be controlled by the output of the comparator (9). In corresponding manner, the voltage drop controls switches for the corresponding change of the amplification factor of each of the two (voltage) amplifiers which are provided for the amplification of one signal voltage each.

The (voltage) amplifiers are automatically switched as a function of the sum of the supply currents in such a manner that their amplification factor changes so as to stabilize the variations in field strength.

In view of the foregoing, the change in amplification is effected in an inexpensive manner stepwise with a controlled switch which is actuated by the output of a comparator. The comparator compares a threshold value with a voltage which corresponds to the sum of the supply currents of the voltage-controlled sources of current and is obtained as voltage drop on a sum-current resistance. Therefore, in this case there is no continuous control of the amplification factor of the (voltage) amplifiers. The frequency with which the switchings of the amplification factors take place is in this case limited by an integrating resistor-capacitor circuit.

More specifically, the input (36) of the comparator (14, 15) is connected to the sum-current resistor (33) via an integrating resistor-capacitor circuit (34, 35).

The integrating resistor-capacitor circuit furthermore serves to damp the deflection of the pointer.

Each voltage-controlled source of current operates in two measurement characteristic-curve quadrants and is formed in a particularly economic manner by an integrated circuit whose supply current is a direct measure of the amount of the signal voltage or proportional current at the output of the respective source of current.

The two voltage-controlled sources of current may be formed by a common quadruple operation amplifier on one chip, the common supply of this quadruple operation amplifier can be evaluated directly as sum current. That is that each voltage-controlled source (4, 6) is formed of an integrated circuit (IC) and that the current supply lines of both integrated circuits are conducted over the sum-current resistor (7).

With such construction, each voltage-controlled source is formed essentially of two operational amplifiers (26, 30 and 27, 31 respectively) which are connected one behind the other in the signal-measurement direction and, as impedance transformer for the feeding of one of the two coil branches (1, 2), are switched with a current which is proportional to the sine current voltage, that the total of four operational amplifiers (26, 27, 30, 31) are formed as quadruple operational amplifiers (II) on one chip and that a sum-current resistor (33) is connected in a common supply-current line of the quadruple operational amplifiers (II).

The switching of the amplification factors of the (voltage) amplifiers is advantageously effected in a negative-feedback branch by the connecting and disconnecting of a resistance which enters, in accordance with known equations, into the transmission behavior of the amplifier arrangement.

Thus the amplification factors of the (voltage) amplifiers (12, 13) can be switched by, in each case, a controlled semiconductor switch (20 and 21 respectively) in a resistor negative-feedback branch (16, 17 and 18, 19 respectively) of the (voltage) amplifier.

With the above and other objects and advantages in view, the present invention will become more clearly understood in connection with the detailed description of preferred embodiments, when considered with the accompanying drawings.

DETAILED DESCRIPTION OF THE PREFERRED EMBODIMENTS

Figure 1:
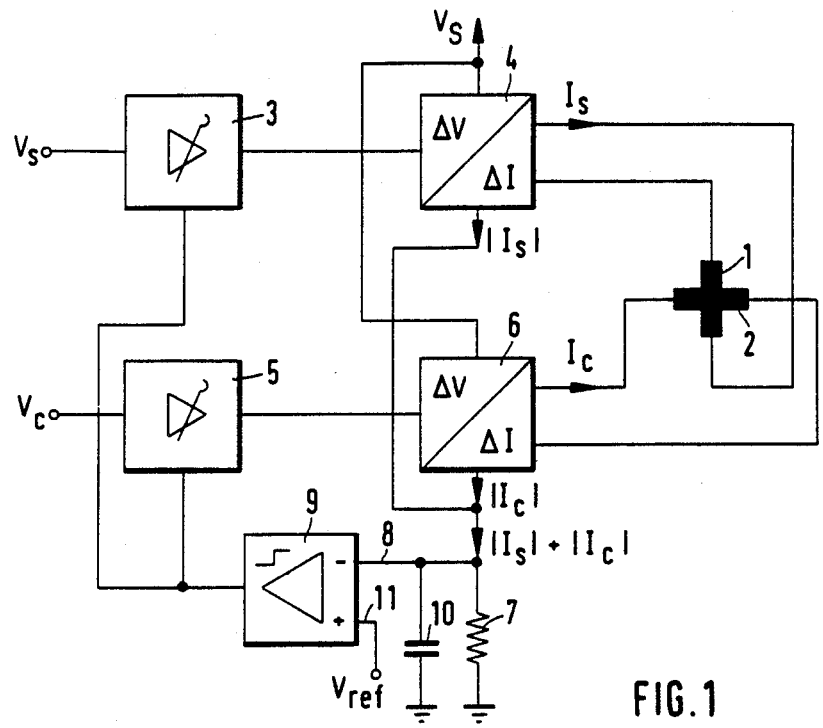
FIG. 1 is a simplified block diagram of a first embodiment of the circuit.

In FIG. 1, each coil branch 1 and 2 has an amplifier branch associated with it. For the amplification of a sine signal voltage supplied by a probe (not shown) there is provided a switchable voltage amplifier 3 which is formed as measurement amplifier. The voltage amplifier 3 controls a voltage-controlled source of current 4 to which the coil branch 1 is connected.

In similar manner, the amplifier branch having the switchable voltage amplifier 5 for the amplification of a cosine signal voltage is formed by the probe and a voltage-controlled source of current 6 which feeds the coil branch 2.

Both voltage-controlled current sources 4 and 6 are so fed by a supply voltage V that their supply currents flow through a common sum-current resistor 7.

The sum-current resistor 7 is connected to an input 8 of a comparator 9. A capacitor 10 at said input serves to smooth the voltage at the sum-current resistor 7. A second input 11 of the comparator is connected to the potential of a reference voltage $V_{ref}$.

On its output side, the comparator is so connected to the switchable voltage amplifiers 3 and 5 that their amplification factors are changed in agreement with each other as a function of the magnitude of the comparator output.

The voltage-controlled current sources can be controlled in two quadrants of a characteristic curve so that the sine current and the cosine current at their outputs can flow through the corresponding coil branches 1 and 2 for 360 degrees indication in both directions. In this connection, however, each of the supply currents, $|I_s|$ and $|I_c|$ respectively, does not change its direction but retains it in the sense of formation of the amount of the current $|I_s|$ and $|I_c|$ respectively. There is thus a voltage drop on the sum-current resistor 7 which corresponds to the sum of the amounts of the supply currents $|I_s|$ and $|I_c|$. As soon as this voltage drop, which is smoothed by the capacitor 10, exceeds the reference voltage $V_{ref}$, the amplification factors of the voltage amplifiers 3 and 5 are jointly switched in the direction which reduces the amplification. In this way, the voltages which control the current sources 4 and 6 drop accordingly, so that said sources cannot be over driven. Similarly, the sine current and the cosine current through the coil branches 1 and 2 as well as the amounts of the corresponding supply currents $|I_s|$ and $|I_c|$ are reduced. The comparator—after a delay in signal associated with the capacitor 10—switches the two switchable voltage amplifiers 3 and 5 back to full amplification so that the source which has been described can start all over again.

The comparator 9 therefore switches in the manner of a two-position controller which switches the amplification of the voltage amplifiers 3 and 5 in timed fashion. The switching frequency is reduced by the capacitor 10 to a favorable value which also permits a steady indication of the pointer a cross-coil instrument, the indication corresponding to the ratio of the sine current to the cosine current.

Figure 2:
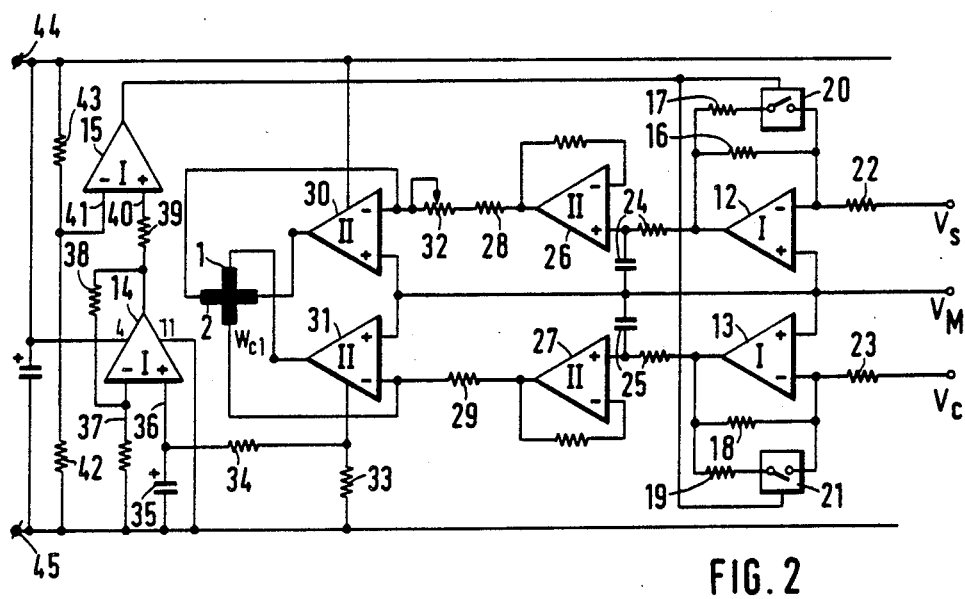
FIG. 2 is a simplified wiring diagram of a circuit developed with two chips.

FIG. 2 shows a quadruple operational amplifier I and a quadruple operational amplifier II developed on one chip.

The quadruple operational amplifier I comprises two voltage amplifiers 12, and 13 as well as a two-stage comparator 14 and 15. The quadruple operational amplifier II comprises amplifiers 26, 27, 30 and 31.

Each voltage amplifier 12 and 13 has two negative feedback resistors 16, 17 and 18, 19 respectively. The negative feedback resistors 17 and 19 can be switched into the negative feedback branch by a controlled semiconductor switch 20 and 21 respectively.

The amplification factor of each voltage amplifier results, in accordance with a known relationship from the ratio of the feedback resistance 16, possibly in parallel with 17 depending on the position of switch 20, to the input resistance 22. The amplification of the voltage amplifier 13 can be switched by switch 21 in the same way.

The outputs of the voltage amplifiers feed corresponding inputs of impedance-transformer amplifiers 26 and 27 via resistor-capacitor circuits 24 and 25 respectively for additional damping. Via coupling resistors 28 and 29, each impedance transformer is connected to a second amplifier stage 30 or 31 respectively which supplement the impedance transformer for the voltage-controlled source of current for one of the coil branches 1 and 2 respectively.

A variable resistor 32 connected in series with the coupling resistor 28 serves to balance the two channels in order to compensate for amplification and/or measuring instrument errors.

The entire supply current of the quadruple operational amplifier II flows through a sum-current resistor 33. The latter is connected, via a series resistor 34 which together with a capacitor 35 forms an integrating resistor-capacitor circuit, to an input 36 of the two-stage comparator 14 and 15, whose second input 37 is fed back via a resistor 38. The output of this amplifier stage 14 is connected to a first input 40 of the comparator stage 15 via a resistor 39 which results in closed-circuit current compensation. A second input 41 of the second comparator stage is acted on by a reference voltage via voltage divider comprising resistors 42, 43.

Terminals 44, 45 are connected to a stabilized supply voltage.

The basic manner of operation of this circuit coincides with the function discussed in connection with FIG. 1:

The current taken up by the quadruple operational amplifier II is, as sum of the amounts of a sinusoidal course of the current corresponding to the sine signal voltage $V_s$ and the cosine shaped course of the current corresponding to the cosine signal voltage $V_c$, as a whole, almost independent of the position of the horizontal component of the earth's induction with respect to the reference line (center line). This sum current, in its turn, produces at the sum-current resistor 33 a voltage drop which, via the integrating resistor-capacitor circuit 34, 35 and the amplifier stage 14, so controls the second comparator stage 15 that the controlled switches 20, 21 are closed or opened whenever the voltage goes above or below the reference voltage. The amplification factors of the amplifiers 12, 13 are thus, as a whole, so switched in synchronism as to produce at the sum resistor 33 a voltage having an average value which is comparable to the reference voltage $V_{ref}$ selected by the choice of resistors 42 and 43. This voltage average value is maintained approximately constant as a result of the regulating. From this there results a constant amount of the sum of currents through the two coil branches 1 and 2 practically independently of the position of the vehicle in which the probe is installed with respect to the horizontal component of the earth's field, and practically independently of the amount of the induction of the earth's field at the specific geographical location. Similarly, the circuit regulation regulates the voltages which control the two-stage voltage-controlled current sources 26, 30 and 27, 31 respectively to insure that these voltages do not exceed predetermined values. The two voltage-controlled current sources formed by the quadruple operational amplifier II therefore produce sine and cosine currents which are substantially proportional to the sine signal voltages and cosine signal voltages.

I claim:

1. A circuit for regulating the torque of ratio meters, particularly of compass indicators, in which two-quadrant voltage-controlled sources of current are connected to respective coil branches voltage amplifiers and feed the two current sources with a sine signal voltage and cosine signal voltage, respectively, the regulating circuit comprising
   means for forming the sum of supply currents of the two voltage-controlled current sources; and
   means for automatically altering amplification factors of said amplifiers as a function of said sum of the supply currents,
   said sum forming means comprises a resistor inserted into a line carrying the sum of the supply currents; said circuit further comprising a comparator having an input connected to said resistor; and wherein said altering means comprises a controlled switch which is controllable by the output of the comparator to change the amplification factor of each of the two voltage amplifiers, and wherein
   each voltage-controlled source is formed essentially of two operational amplifiers which are connected in tandem, said current sources serving as impedance transformers for the feeding of one of the two coil branches, and wherein one of said current sources is switched with a current which is proportional to the sine current voltage, a total of four operational amplifiers being formed as a quadruple operational amplifier on one chip, the resistor being connected in a common supply-current line of the quadruple operational amplifiers.

2. The circuit according to claim 1 wherein
   each voltage-controlled current source is formed of an integrated circuit (IC), and wherein current supply for both integrated circuits are conducted via said resistor.

3. The circuit according to claim 1 wherein
   said resistor is coupled by an integrating resistor-capacitor circuit to an input of said comparator.

4. The circuit according to claim 1 wherein
   said controlled switch is a controlled semiconductor switch in a resistor negative-feedback branch of each of said voltage amplifiers.

5. A circuit for regulating the torque of ratio meters, particularly of compass indicators, in which two-quadrant voltage-controlled sources of current are connected to respective coil branches voltage amplifiers and feed the two current sources with a sine signal voltage and cosine signal voltage, respectively, the regulating circuit comprising
   means for forming the sum of supply currents of the two voltage-controlled current sources; and
   means for automatically altering amplification factors of said amplifiers as a function of said sum of the supply currents, and wherein
   each voltage-controlled source is formed essentially of two operational amplifiers which are connected in tandem, said current sources serving as impedance transformers for the feeding of one of two coil branches, and wherein one of said current sources is switched with a current which is proportional to the sine current voltage, a total of four operational amplifiers being formed as a quadruple operational amplifier on one chip, a resistor being connected in a common supply-current line of the quadruple operational amplifiers.

6. The circuit according to claim 5 wherein
   each voltage-controlled current source is formed of an integrated circuit (IC), and wherein current supply for both integrated circuits are conducted via said resistor.

* * * * *